US007696521B2

(12) United States Patent
Lee et al.

(10) Patent No.: US 7,696,521 B2

(45) Date of Patent: Apr. 13, 2010

(54) ORGANIC LIGHT EMITTING DIODE DISPLAY DEVICE HAVING FIRST AND SECOND CAPACITORS DISPOSED ON A SUBSTRATE WHEREIN THE FIRST CAPACITOR COMPRISES AN UNDOPED SEMICONDUCTOR LAYER ELECTRODE.

(75) Inventors: Jae-Yong Lee, Suwon-si (KR); Yang-Wan Kim, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 93 days.

(21) Appl. No.: 12/013,698

(22) Filed: Jan. 14, 2008

(65) Prior Publication Data

US 2008/0315189 A1 Dec. 25, 2008

(30) Foreign Application Priority Data

Jun. 21, 2007 (KR) ...................... 10-2007-0061256

(51) Int. Cl.
*H01L 51/52* (2006.01)
*H01L 51/56* (2006.01)

(52) U.S. Cl. ............................ 257/72; 257/40; 257/59; 257/E29.273; 257/E51.018

(58) Field of Classification Search ................... 257/40, 257/49, 66, 290–291, 296, 59, 72, E29.273, 257/E51.018
See application file for complete search history.

(56) References Cited

U.S. PATENT DOCUMENTS 6,521,913 B1 * 2/2003 Murade ....................... 257/59
2004/0095298 A1 5/2004 Miyazawa
2005/0083270 A1 4/2005 Miyazawa
2006/0132399 A1 6/2006 Miyazawa

FOREIGN PATENT DOCUMENTS

| | | |
|---|---|---|
| EP | 1 416 466 | 10/2003 |
| JP | 2003-167533 | 6/2003 |
| JP | 2004-145281 | 5/2004 |
| JP | 2005-099715 | 4/2005 |
| JP | 2005-352398 | 12/2005 |
| KR | 2004-21845 | 3/2004 |
| KR | 2005-14849 | 2/2005 |
| KR | 2005-104605 | 11/2005 |

(Continued)

OTHER PUBLICATIONS

European Search Report issued in European Patent Application No. 08252154.3 on Oct. 27, 2008.
Matsueda, Y. et al.; "AMOLED with Integrated 6-Bit Gamma Compensated Digital Data Driver", SID 04 Digest, pp. 1116-1119.
U.S. Appl. No. 12/122,130, filed May 16, 2008, Jae-Yong Lee, et al.
Korean Publication No. 2005-104611, dated Nov. 3, 2005.
Korean Publication No. 2005-110940, dated Nov. 24, 2005.

*Primary Examiner*—Anh D Mai
(74) *Attorney, Agent, or Firm*—Stein McEwen, LLP

(57) ABSTRACT

An organic light emitting diode (OLED) display device and a method of fabricating the same capable of minimizing the number of process operations and a decrease in aperture ratio. The OLED display device includes a compensation circuit to compensate for a threshold voltage of a driving transistor. A pixel circuit of the OLED display device can be stably driven, can minimize a threshold voltage of a driving transistor using a minimized structure, and can increase an aperture ratio of the display device.

12 Claims, 5 Drawing Sheets

FOREIGN PATENT DOCUMENTS

| | | |
|---|---|---|
| KR | 2005-104610 | 11/2005 |
| KR | 2006-12931 | 2/2006 |
| KR | 2006-19022 | 3/2006 |
| KR | 10-570763 | 4/2006 |
| KR | 2006-50204 | 5/2006 |
| KR | 2006-63254 | 6/2006 |
| KR | 10-0599727 | 7/2006 |
| KR | 10-599791 | 7/2006 |
| KR | 2007-12979 | 1/2007 |
| KR | 2007-64438 | 6/2007 |
| KR | 2008-48831 | 6/2008 |
| WO | WO 2006/054189 | 5/2006 |

* cited by examiner

ORGANIC LIGHT EMITTING DIODE DISPLAY DEVICE HAVING FIRST AND SECOND CAPACITORS DISPOSED ON A SUBSTRATE WHEREIN THE FIRST CAPACITOR COMPRISES AN UNDOPED SEMICONDUCTOR LAYER ELECTRODE.

CROSS-REFERENCE TO RELATED APPLICATION

This application claims the benefit of Korean Patent Application No. 2007-61256, filed Jun. 21, 2007, the disclosure of which is incorporated herein by reference.

BACKGROUND OF THE INVENTION

1. Field of the Invention

Aspects of the present invention relate to an organic light emitting diode (OLED) display device and a method of fabricating the same and, more particularly, to an OLED display device which includes a compensation circuit capable of compensating for a threshold voltage of a driving transistor, and can decrease the number of process operations, and minimize a decrease in aperture ratio, and a method of fabricating the OLED display device.

2. Description of the Related Art

A flat panel display device (FPD) has become strongly relied upon as a display device that has superseded a cathode-ray tube (CRT) display device because the FPD is fabricated to be lightweight and thin. Typical examples of the FPD are a liquid crystal display (LCD) device and an organic light emitting diode (OLED) display device. As compared to the LCD, the OLED display device has a higher luminance, a wider viewing angle, and can be made thinner because the OLED display device needs no backlight.

In the OLED display device, electrons and holes are injected into an organic thin layer through a cathode and an anode and recombine to generate excitons. The electrons and holes emit light of a certain wavelength as the electrons and holes recombine.

The OLED display device may be classified into a passive matrix type and an active matrix type depending upon how the device drives N×M pixels that are arranged in a matrix shape. An active matrix type OLED display device includes a circuit using a thin film transistor (TFT). A passive matrix type OLED display device can be fabricated by a simple process since anodes and cathodes are arranged in a matrix shape on a display region. However, the passive matrix type OLED display device is applied only to low-resolution, small-sized display devices because of the resolution limit, high driving voltage, and short lifetimes of materials. By comparison, in the active matrix type OLED display device, a TFT is mounted in each pixel of a display region. Thus, a constant amount of current can be supplied to each pixel so that the active matrix type OLED display device can emit light with a stable luminance. Also, since the active matrix type OLED display device consumes less power, the active matrix type OLED display device can be applied to high-resolution, large-sized display devices.

In an active matrix type OLED display device, a threshold voltage of a driving transistor included in each pixel has an inconstant deviation due to problems in the fabrication of a TFT. Since the inconstant deviation of the threshold voltage makes the luminance of the OLED display device nonuniform, the OLED display device needs to include a pixel circuit having a variety of compensation circuits in order to compensate for such inconstant deviation of the threshold voltage.

However, the pixel circuit of the OLED display device further includes a plurality of TFTs and at least one capacitor in order to compensate for the deviation of the threshold voltage of the driving transistor. As a result, the pixel circuit has a complicated configuration, thus degrading reliability and complicating fabrication processes.

SUMMARY OF THE INVENTION

Aspects of the present invention provide an organic light emitting diode (OLED) display device which minimizes the number of thin film transistors (TFTs) and capacitors required for compensating for a threshold voltage of a driving transistor and simplifies processes for forming the TFTs and capacitors, and a method of fabricating the OLED display device.

According to aspects of the present invention, an OLED display device includes: a substrate including a first capacitor region, a second capacitor region, and a thin film transistor (TFT) region; a first capacitor disposed on the first capacitor region of the substrate, the first capacitor including a first semiconductor layer having an impurity doped first region, a first electrode, and a first insulating layer interposed between the first semiconductor layer and the first electrode; a second capacitor disposed on the second capacitor region of the substrate, the second capacitor including a second semiconductor layer, a second electrode, and a second insulating layer interposed between the second semiconductor layer and the second electrode; a plurality of TFTs disposed on the TFT region of the substrate, each TFT including a third semiconductor layer having source and drain regions and a channel region, a gate insulating layer, a gate electrode, and source and drain electrodes; a power supply voltage line disposed on the first capacitor and electrically connected to the first region of the first semiconductor layer; and an organic light emitting diode disposed on the TFTs and including at least one organic emission layer.

According to aspects of the present invention, a method of fabricating an OLED display device includes: forming a first semiconductor layer, a second semiconductor layer, and a third semiconductor layer in a first capacitor region, a second capacitor region, and a TFT region, respectively, of a substrate; forming a first insulating layer on the first semiconductor layer; forming a second insulating layer on the second semiconductor layer; forming a gate insulating layer on the third semiconductor layer; forming a first electrode on the first insulating layer in a position to cover a partial region of the first semiconductor layer; forming a second electrode on the second insulating layer in a position to cover the second semiconductor layer; forming a gate electrode on the gate insulating layer in a position to cover a central portion of the third semiconductor layer; forming a first region of the first semiconductor layer and source and drain regions of the third semiconductor layer by doping impurities using the first electrode, the second electrode, and the gate electrodes as masks; forming an interlayer insulating layer on the first electrode, the second electrode, and the gate electrode; forming a first contact hole and second contact holes in the interlayer insulating layer to partially expose the first region and the source and drain regions; forming a power supply voltage line through the first contact hole to connect to the first region; forming a source electrode and a drain electrode through the second contact holes to respectively contact the source and drain regions of the third semiconductor layer; and forming an organic light emitting diode including at least one organic layer electrically connected to the source and drain electrodes and the power supply voltage line.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1A:
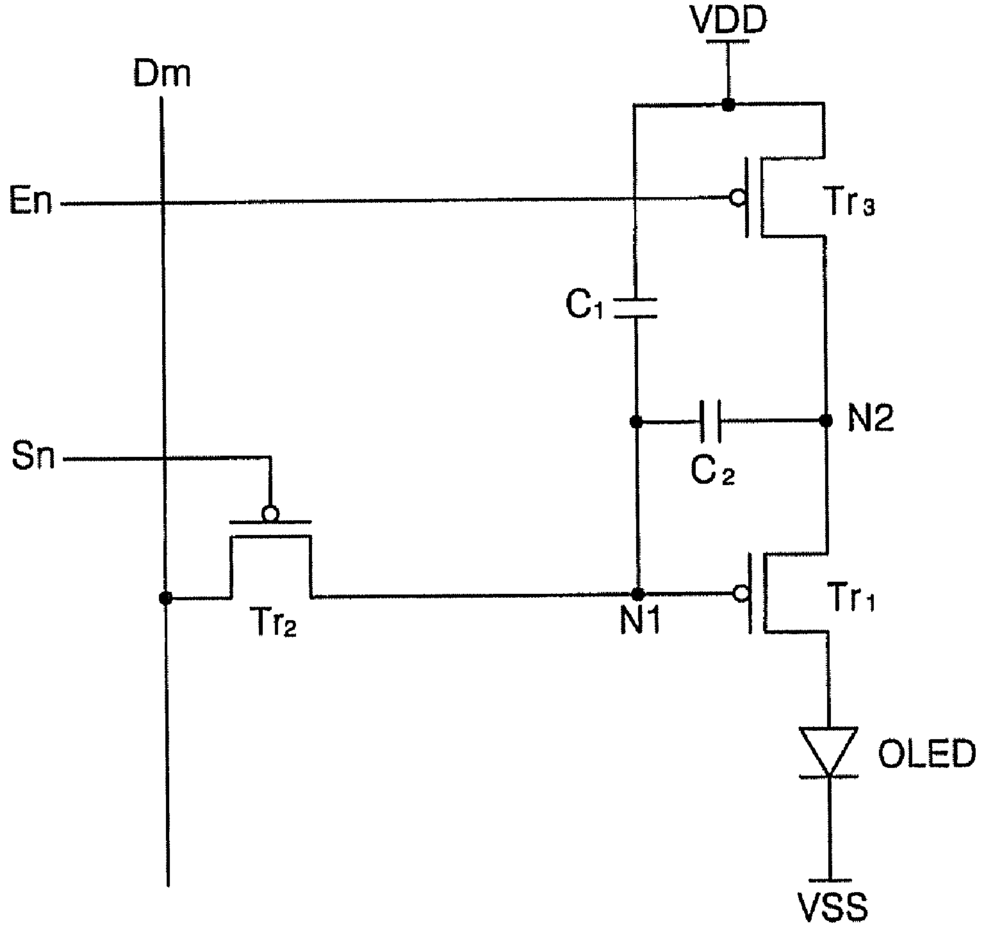
FIG. 1A is a circuit diagram of a pixel circuit of an organic light emitting diode (OLED) display device according to an exemplary embodiment of the present invention.

Reference will now be made in detail to the present embodiments of the present invention, examples of which are illustrated in the accompanying drawings, wherein like reference numerals refer to the like elements throughout. The embodiments are described below in order to explain the aspects of the present invention by referring to the figures.

Aspects of the present invention will now be described more fully hereinafter with reference to the accompanying drawings, in which exemplary embodiments of the invention are shown. In the drawings, the thicknesses of layers and regions are exaggerated for clarity. The same reference numerals are used to denote the same elements. It will also be understood that when a portion is referred to as being "connected" to another portion, it can be "directly connected" to the other portion or "electrically connected" to the other portion by disposing a third or additional elements therebetween. Additionally, when a first element is said to be "disposed" on a second element, the first element can directly contact the second element or one or more other elements may be disposed therebetween.

Figure 2:
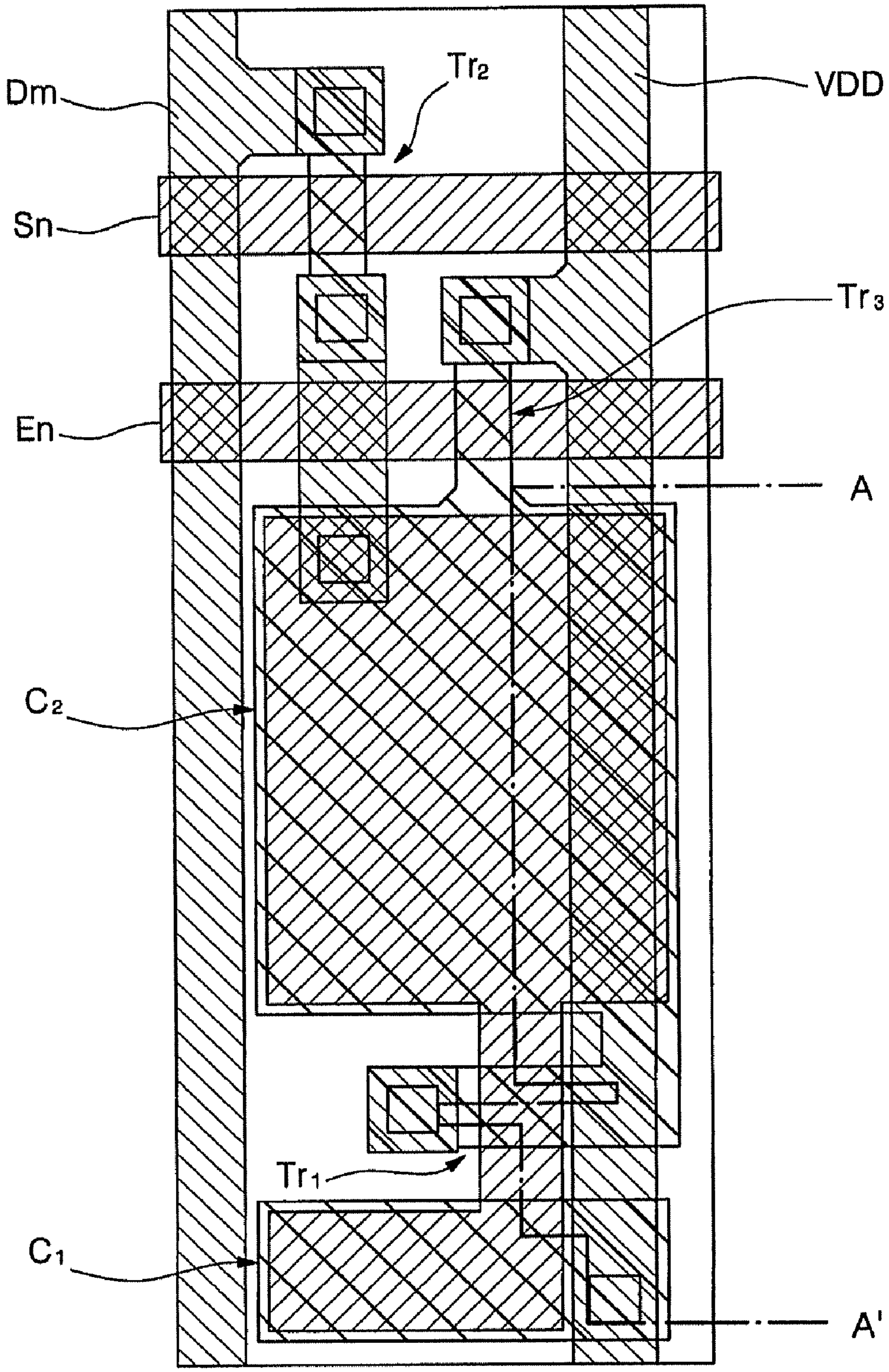
FIG. 2 is a plan view of the pixel circuit of the OLED display device shown in FIG. 1A.

FIG. 1A is a circuit diagram of a pixel circuit of an organic light emitting diode (OLED) display device according to an exemplary embodiment of the present invention, and FIG. 2 is a plan view of the pixel circuit of the OLED display device shown in FIG. 1A. Referring to FIGS. 1A and 2, the pixel circuit of the OLED display device includes an organic light emitting diode OLED, a driving transistor Tr1, a first switching transistor Tr2, a second switching transistor Tr3, a first capacitor C1, and a second capacitor C2. The first switching transistor Tr2, the second switching transistor Tr3, and the drive transistor Tr1 may be independently NMOS or PMOS transistors. Further, the organic light emitting diode OLED is connected between the drive transistor Tr1 and a ground VSS.

The driving transistor Tr1 is electrically connected between the organic light emitting diode OLED and a second node N2, and the driving transistor Tr1 supplies a driving current to the organic light emitting diode OLED according to the voltage of a first node N1. The first switching transistor Tr2 is electrically connected between a data line Dm and the first node N1 and transmits a data signal from the data line Dm to the first node N1 in response to a scan signal from a scan line Sn. The second switching transistor Tr3 is electrically connected between the second node N2 and a power supply voltage line VDD, and the second switching transistor Tr3 transmits a power supply voltage to the second node N2 in response to a control signal applied from the control line En.

The first capacitor C1 is electrically connected between the power supply voltage line VDD and the first node N1, and the first capacitor C1 stores a voltage corresponding to a difference between the voltage of the first node N1 and the power supply voltage as supplied by the power supply line VDD.

The second capacitor C2 is electrically connected between the first node N1 and the second node N2, and second capacitor C2 stores a voltage corresponding to a difference between the voltage of the first node N1 and a voltage of the second node N2.

Figure 1B:
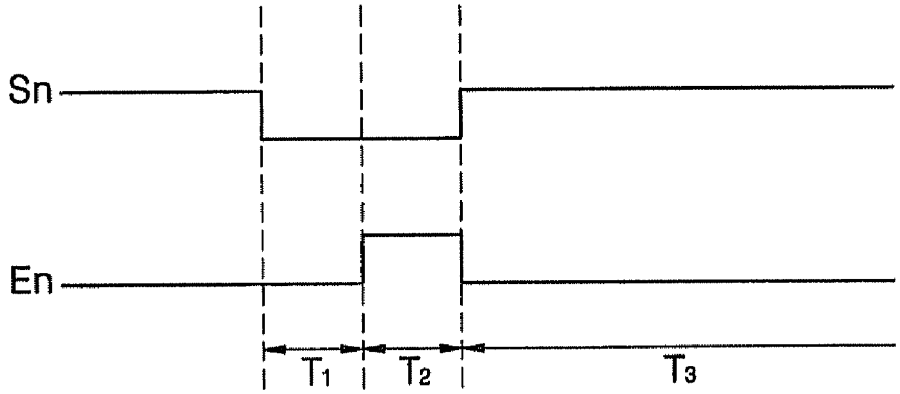
FIG. 1B is a signal waveform diagram illustrating the driving of the pixel circuit of the OLED display device shown in FIG. 1A.

FIG. 1B is a signal waveform diagram illustrating the driving of the pixel circuit of the OLED display device shown in FIG. 1A. The driving of the pixel circuit of the OLED display device according to an exemplary embodiment of the present invention will now be described with reference to FIGS. 1A, 1B, and 2.

Initially, a low-level scan signal S and a low-level control signal E are respectively applied through a scan line Sn and a control line En during a first period T1. The first switching transistor Tr2 is turned on in response to the low-level scan signal S, so that a data signal D is transmitted through the data line Dm to the first node N1. Thus, the first node N1 has the same voltage as the voltage of the data signal, and the first capacitor C1, which is electrically connected between the first node N1 and the power supply voltage line VDD, stores a voltage corresponding to the difference between the voltage of the data signal and the power supply voltage.

Also, the second switching transistor Tr3 is turned on in response to the low-level control signal E, so that the power supply voltage is transmitted through the power supply voltage line VDD to the second node N2. Thus, the second node N2 has the same voltage as the power supply voltage, and the second capacitor C2, which is electrically connected between the second node N2 and the first node N1, stores the voltage corresponding to the difference between the voltage of the data signal and the power supply voltage like the first capacitor C1.

During the first period T1, the power supply voltage from the power supply line VDD is applied to the second node N2 and the data signal is transmitted to the first node N1. Thus, the driving transistor Tr1 is turned on, so that a driving current corresponding to the voltage of the data signal transmitted to the first node N1 is supplied to the organic light emitting diode OLED. However, since the first period T1 is shorter than a third period T3, the first period T1 does not greatly affect the entire luminance of the OLED display device.

During a second period T2, a low-level scan signal S is transmitted to the scan line Sn, and a high-level control signal E is transmitted to the control line En. The first switching transistor Tr2 remains turned on in response to the low-level scan signal S as in the first period T1, so that the voltage of the data signal is maintained at the first node N1. Also, the first capacitor C1 stores the voltage corresponding to the difference between the voltage of the data signal and the power supply voltage.

The second switching transistor Tr3 is turned off in response to the high-level control signal E, so that the power supply voltage cannot be applied to the second node N2. Since the first and second nodes N1 and N2 are respectively connected to a gate terminal and a source terminal of the driving transistor Tr1, the second capacitor C2 stores a threshold voltage of the driving transistor Tr1, and a voltage corresponding to the sum of the voltage of the data signal and the threshold voltage is maintained at the second node N2.

Thus, during the second period T2, the driving transistor Tr1 is turned on due to the voltage of the data signal transmitted to the first node N1 and supplies a driving current corresponding to the voltage of the data signal applied to the first node N1 to the organic light emitting diode OLED as in the first period T1. However, since the second period T2 is shorter than the third period T3, the second period T2 does not greatly affect the luminance of the OLED display device. Also, since the voltage of the second node N2 is higher than the voltage of the first node N1 by the threshold voltage, the driving transistor Tr1 cannot supply a driving current sufficient to allow the organic light emitting diode OLED to exhibit sufficient luminance.

Next, during the third period T3, a high-level scan signal S is transmitted to the scan line Sn and a low-level control signal E is transmitted to the control line En. The second switching transistor Tr3 is turned on in response to the low-level control signal E, so that the second node N2 has the same voltage as the power supply voltage. The switching transistor Tr2 is turned off in response to the high-level scan signal S and thus, a voltage as shown in Equation 1 is maintained at the first node N1 due to a coupling effect between the first capacitor C1 and the second capacitor C2:

$$V_{N1} = V_{data} + \frac{C_2}{(C_1 + C_2)}(ELVDD - V_{data} - V_{th}), \quad (1)$$

wherein $V_{N1}$ refers to a voltage of the first node N1, $C_1$ refers to the capacitance of the first capacitor C1, $C_2$ refers to the capacitance of the second capacitor C2, $V_{data}$ refers to the voltage of the data signal, ELVDD refers to the power supply voltage, and $V_{th}$ refers to the threshold voltage of the driving transistor Tr1.

During the third period T3, the driving transistor Tr1 supplies a driving current to the organic light emitting diode OLED according to the voltage $V_{N1}$ of the first node N1. Therefore, by controlling a capacitance ratio between the first capacitor C1 and the second capacitor C2, i.e., $C_2(C_1+C_2)^{-1}$), a nonuniformity of the luminance of the OLED display device due to the threshold voltage of the driving transistor Tr1 can be minimized.

The OLED display device according to the exemplary embodiment of the present invention can compensate for the threshold voltage of the driving transistor Tr1 using three TFTs and two capacitors, thus minimizing a decrease in an aperture ratio caused by a compensation circuit.

Hereinafter, a method of fabricating the OLED display device shown in FIGS. 1A and 2 will now be described with reference to FIGS. 1A and 2.

Figure 3A:
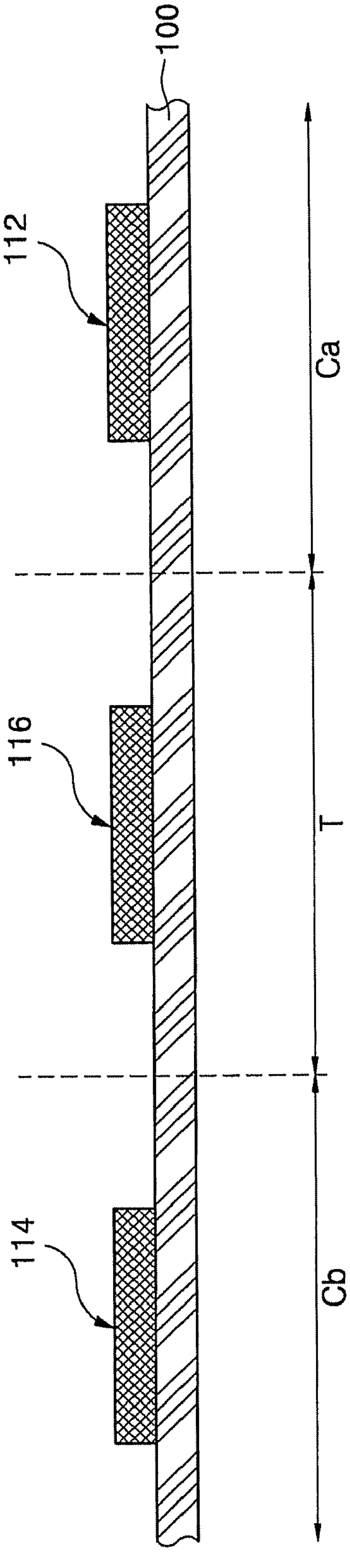
FIGS. 3A through 3D are cross-sectional views illustrating a method of fabricating an OLED display device according to an exemplary embodiment of the present invention.

FIGS. 3A through 3D are cross-sectional views taken along line A-A' of FIG. 2, which illustrate a method of fabricating the OLED display device shown in FIG. 2. Referring to FIG. 3A, a substrate 100 includes a first capacitor region Ca, a second capacitor region Cb, and a TFT region T. The substrate 100 is formed of glass, synthetic resin, or stainless steel. A first semiconductor layer 112, a second semiconductor layer 114, and a third semiconductor layer 116 are respectively formed in the first capacitor region Ca, the second capacitor region Cb, and the TFT region T of the substrate 100. In this case, the first, second, and third semiconductor layers 112, 114, and 116 may be made of amorphous silicon (a-Si) or polycrystalline silicon (poly-Si) and may be formed using respectively different methods.

The first, second, and third semiconductor layers 112, 114, and 116 may be simultaneously formed of poly-Si having the same crystal structure. In this case, the formation of the first, second, and third semiconductor layers 112, 114, and 116 may include depositing an a-Si layer (not shown) on the substrate 100, crystallizing the a-Si layer into a poly-Si layer, and patterning the poly-Si layer to form the first, second, and third semiconductor layers 112, 114, and 116. The crystallization of the a-Si layer into the poly-Si layer may be performed using a solid phase crystallization (SPC) technique, a rapid thermal annealing (RTA) technique, a metal induced crystallization (MIC) technique, a metal induced lateral crystallization (MILC) technique, an excimer laser annealing (ELA) technique, or a sequential lateral solidification (SLS) technique.

Also, when the first, second, and third semiconductor layers 112, 114, and 116 are formed of poly-Si, a buffer layer (not shown) may be formed on the substrate 100 in advance in order to prevent the diffusion of impurities of the substrate 100 during the crystallization of the a-Si layer. The buffer layer may be formed of $SiN_x$, $SiO_2$, or a stacked layer thereof.

Figure 3B:
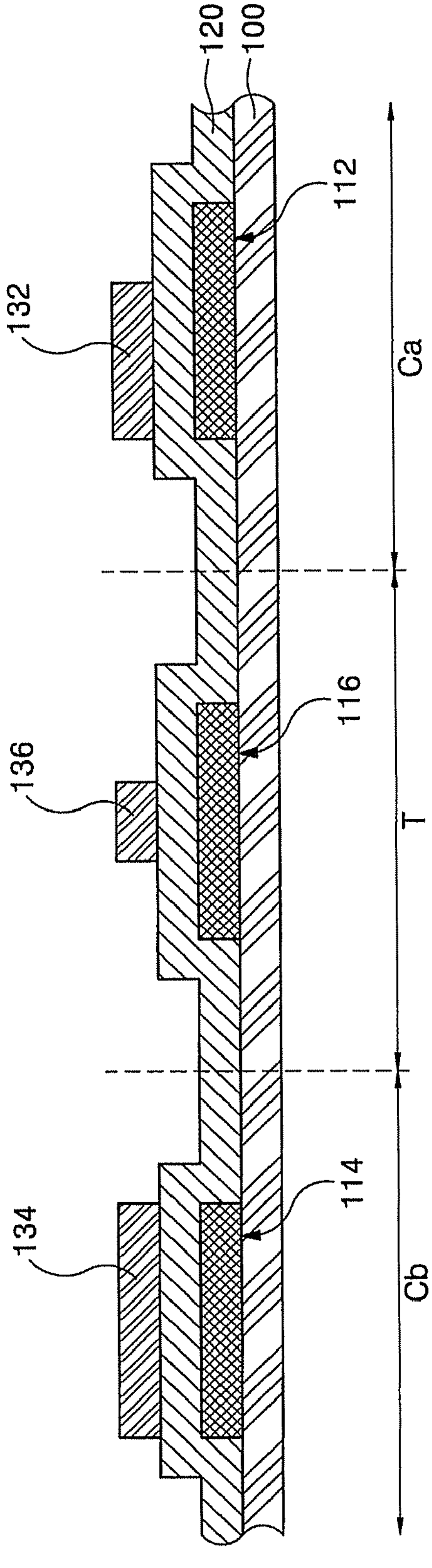

Referring to FIG. 3B, a gate insulating layer 120 is formed on the substrate 100 having the first, second, and third semiconductor layers 112, 114, and 116. Unlike that shown in the drawing, a first insulating layer (not shown) and a second insulating layer (not shown) may be formed on the first and second semiconductor layers 112 and 114, respectively, so as to control a capacitance ratio between the first capacitor C1 and the second capacitor C2. In this case, the gate insulating layer 120 may or may not be formed on the first and second insulating layers.

Thereafter, a first electrode 132, a second electrode 134, and a gate electrode 136 are formed on the gate insulating layer 120 in positions corresponding to the first, second, and third semiconductor layers 112, 114, and 116, respectively. In this case, the first electrode 132 and the gate electrode 136 are formed to have smaller areas than the first and third semiconductor layers 112 and 116, respectively, so that a portion of the first semiconductor layer 112 and a portion of the third semiconductor layer 116, which do not correspond to the first electrode 132 and the gate electrode 136, respectively, can be doped during a subsequent impurity doping process.

In this case, the first electrode 132, the second electrode 134, and the gate electrode 136 may be simultaneously formed of the same material. However, a capacitance ratio between the first capacitor C1 and the second capacitor C2 can be controlled by adjusting the materials of the first and second electrodes 132 and 134. Referring to FIG. 2, which is a plan view of the pixel circuit of the OLED display device according to an exemplary embodiment of the present invention, the gate electrode 136 of the TFT Tr1 disposed between the first and second capacitors C1 and C2 may be physically brought into contact with the first electrode 132 of the first capacitor C1 and the second electrode 134 of the second capacitor C2, unlike that shown in FIG. 3C.

Figure 3C:
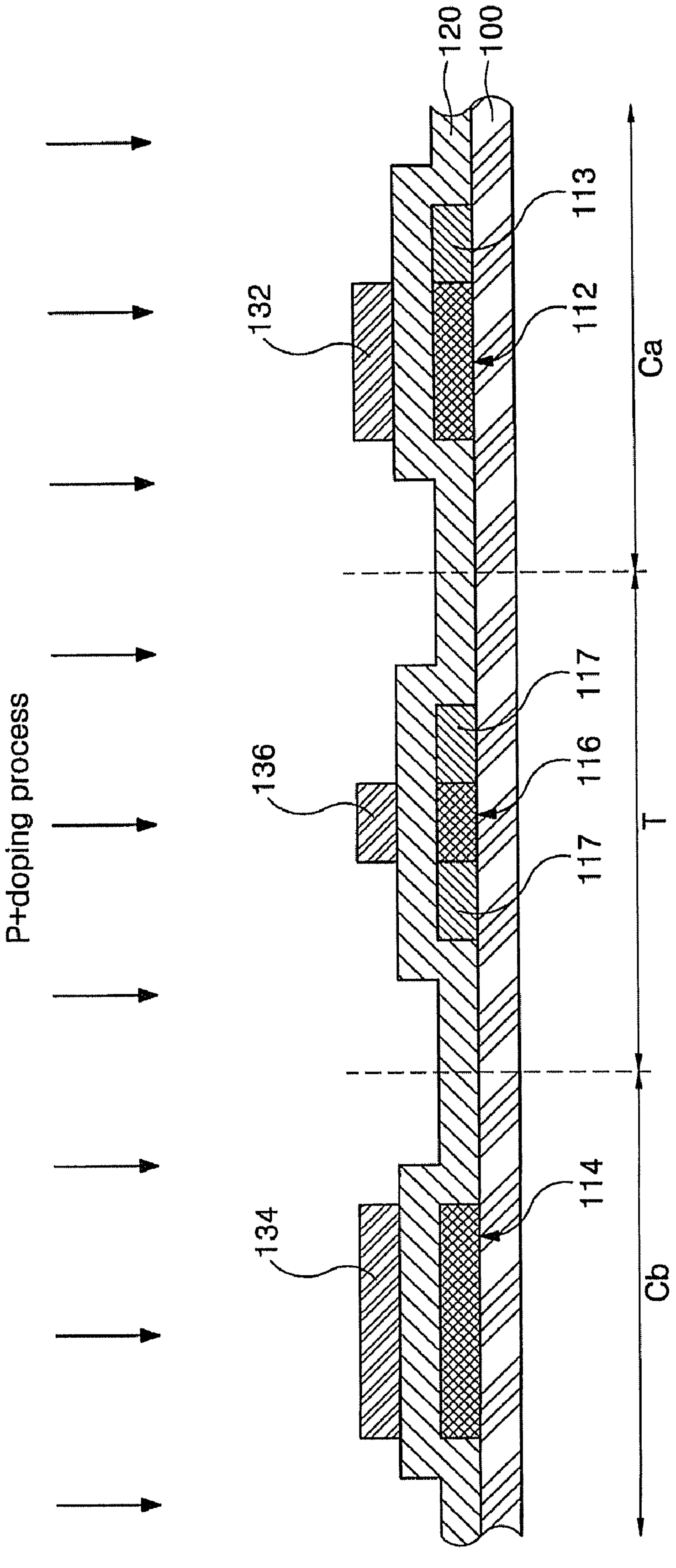

Referring to FIG. 3C, an impurity doping process is performed using the first electrode 132, the second electrode 134, and the gate electrode 136 as masks, so that a region 113 of the first semiconductor layer 112 and regions 117 of the third semiconductor layer 116, which do not correspond to the first electrode 132 and the gate electrode 136, respectively, can be doped with impurities. The doped region 113 of the first semiconductor layer 112 will be electrically connected to a power supply voltage line 152 that will be formed in a subsequent process (FIG. 3D), and the doped regions 117 of the third semiconductor layer 116 will function as source and drain regions 117 of a TFT that will be formed on the TFT region T of the substrate 100. An undoped region of the first semiconductor layer 112 is a lower electrode of the first capacitor C1, and an undoped region of the third semiconductor layer 116 serves as a channel region of the TFT.

Figure 3D:
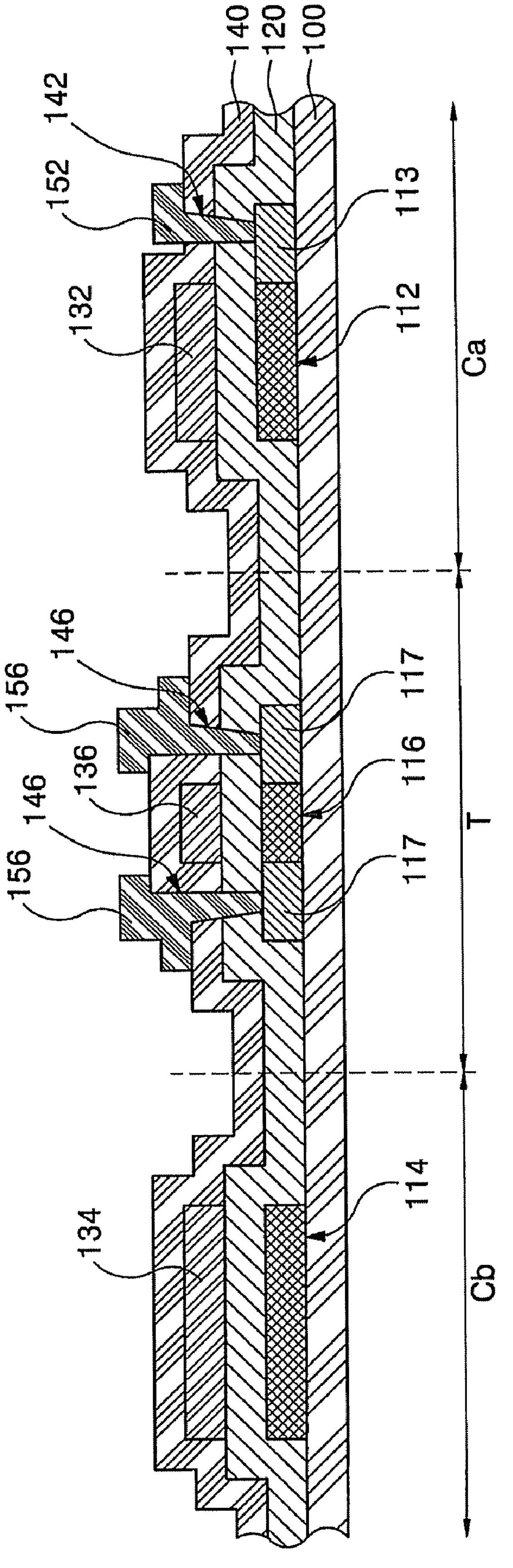

Referring to FIG. 3D, an interlayer insulating layer 140 is formed on the substrate 100 including the first electrode 132, the second electrode 134, the gate electrode 136. Unlike as described above, the impurity doping process may be performed after forming the interlayer insulating layer 140 on the substrate 100 having the first electrode 132, the second electrode 134, and the gate electrode 136.

Thereafter, the gate insulating layer 120 and the interlayer insulating layer 140 are etched, thereby forming a first contact hole 142 and second contact holes 146 to partially expose the doped region 113 of the first semiconductor layer 112 and the doped regions 117 of the third semiconductor layer 116, respectively. A power supply voltage line 152 is formed through the first contact hole 142 and connected to the doped region 113 of the first semiconductor layer 112. Also, source and drain electrodes 156 are formed through the second contact holes 146 and connected to the doped regions 117 of the third semiconductor layer 116. Here, the power supply voltage line 152 and the source and drain electrodes 156 may be simultaneously formed of the same material.

Although not shown in the drawings, an organic light emitting diode (not shown) is formed on the source and drain electrodes 156 using a method of fabricating an OLED display device. In this case, the organic light emitting diode includes a lower electrode, which is electrically connected to the source and drain electrodes 156, an upper electrode, and at least one organic emission layer interposed between the lower and upper electrodes, and a protection layer (not shown) is formed between the organic light emitting diode and the source and drain electrodes 156. Also, a planarization layer may be further formed between the organic light emitting diode and the protection layer. The planarization layer may be an organic insulating layer or an inorganic insulating layer. The organic insulating layer may be an acryl layer, and the inorganic insulating layer may be a silicon oxide layer.

As a result, an OLED display device according to an embodiment of the present invention can minimize a threshold voltage of a driving transistor using three TFTs and two capacitors. Therefore, a decrease in aperture ratio caused by a compensation circuit required for compensating for the threshold voltage of the driving transistor can be minimized. Also, the capacitors may be metal-oxide-silicon (MOS) capacitors that can be formed using the same process as the TFTs, thereby simplifying the fabrication of a pixel circuit of the OLED display device. Furthermore, by electrically connecting a semiconductor layer of the MOS capacitor to a power supply voltage line, the MOS capacitor can operate in a saturated state so that the pixel circuit including the MOS capacitor can be stably driven.

As described above, an OLED display device according to aspects of the present invention includes MOS capacitors and TFTs, which can be simply formed using a same process, so as to compensate for a threshold voltage of a driving transistor. Also, a semiconductor layer of the MOS capacitor is electrically connected to a power supply voltage line so that the MOS capacitor can operate in a saturated state. As a result, a pixel circuit of the OLED display device including the MOS capacitors can be stably driven.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. An organic light emitting diode (OLED) display device comprising:

a substrate having a first capacitor region, a second capacitor region, and a thin film transistor (TFT) region;

a first capacitor disposed on the first capacitor region of the substrate, the first capacitor including a first semiconductor layer having an impurity doped first region extending from an undoped region, a first electrode, and a first insulating layer disposed between the first semiconductor layer and the first electrode;

a second capacitor disposed on the second capacitor region of the substrate, the second capacitor including a second semiconductor layer, a second electrode, and a second insulating layer disposed between the second semiconductor layer and the second electrode;

a thin film transistor (TFT) disposed on the TFT region of the substrate, the TFT including a third semiconductor layer having a source region, a drain region and a channel region, a gate electrode, a gate insulating layer disposed between the gate electrode and the channel region, a source electrode connected to the source region, and a drain electrode connected to the drain region;

a power supply voltage line disposed on the first capacitor and electrically connected to the first region of the first semiconductor layer; and an organic light emitting diode disposed on the TFT and including at least one organic emission layer.

2. The OLED display device according to claim 1, wherein the TFT comprises;

a first switching transistor electrically connected between a data line and a first node;

a second switching transistor electrically connected between the power supply voltage line and a second node; and a driving transistor disposed between the second node and the organic light emitting diode to supply a driving current to the organic light emitting diode according to a voltage of the first node.

3. The OLED display device according to claim 2, wherein the first capacitor is electrically connected between the first node and the power supply voltage line, and the second capacitor is electrically connected between the first node and the second node.

4. The OLED display device according to claim 1, wherein the first semiconductor layer, the second semiconductor layer, and the third semiconductor layer have a same crystal structure.

5. The OLED display device according to claim 1, wherein the first insulating layer and the second insulating layer are formed of a same material.

6. The OLED display device according to claim 5, wherein the first insulating layer, the second insulating layer, and the gate insulating layer are formed of the same material.

7. The OLED display device according to claim 1, wherein the area of the first electrode is smaller than the area of the first semiconductor layer by the area of the first region.

8. The OLED display device according to claim 1, wherein the first electrode and the second electrode are formed of a same material.

9. The OLED display device according to claim 8, wherein the first electrode, the second electrode, and the gate electrode are formed of the same material.

10. The OLED display device according to claim 1, wherein the first electrode is electrically connected to the second electrode.

11. The OLED display device according to claim 1, wherein the first region of the first semiconductor layer and the source and drain regions of the third semiconductor layer are doped with a same impurity.

12. The OLED display device according to claim 11, wherein the first region of the first semiconductor layer and the source and drain regions of the third semiconductor layer are doped with a P-type impurity.

* * * * *